(12) United States Patent
Foong et al.

(10) Patent No.: US 10,031,163 B2
(45) Date of Patent: Jul. 24, 2018

(54) COMPRESSIBLE LAYER WITH INTEGRATED BRIDGE IN IC TESTING APPARATUS

(71) Applicant: JF Microtechnology Sdn. Bhd., Petaling Jaya, Selangor (MY)

(72) Inventors: Wei Kuong Foong, Petaling Jaya (MY); Kok Sing Goh, Petaling Jaya (MY); Shamal Mundiyath, Petaling Jaya (MY); Eng Kiat Lee, Petaling Jaya (MY)

(73) Assignee: JF MICROTECHNOLOGY SDN. BHD., Petaling Jaya (MY)

( * ) Notice: Subject to any disclaimer, the term of this patent is extended or adjusted under 35 U.S.C. 154(b) by 246 days.

(21) Appl. No.: 14/567,867

(22) Filed: Dec. 11, 2014

(65) Prior Publication Data

US 2015/0168451 A1   Jun. 18, 2015

(30) Foreign Application Priority Data

Dec. 18, 2013  (MY) .............................. 2013004546

(51) Int. Cl.
*G01R 3/00* (2006.01)
*G01R 1/067* (2006.01)
*G01R 1/073* (2006.01)

(52) U.S. Cl.
CPC ........... *G01R 3/00* (2013.01); *G01R 1/06722* (2013.01); *G01R 1/07371* (2013.01); *G01R 1/06733* (2013.01); *Y10T 29/49204* (2015.01)

(58) Field of Classification Search
None
See application file for complete search history.

(56) References Cited

U.S. PATENT DOCUMENTS

| 5,385,477 | A | | 1/1995 | Vaynkof et al. | |
|---|---|---|---|---|---|
| 5,749,738 | A | * | 5/1998 | Johnson | G01R 1/0433 439/66 |
| 6,299,459 | B1 | * | 10/2001 | Botka | G01R 1/0466 439/66 |
| 6,409,521 | B1 | * | 6/2002 | Rathburn | H01R 13/2435 439/66 |
| 6,506,082 | B1 | | 1/2003 | Meek et al. | |
| 6,623,284 | B1 | * | 9/2003 | Korsunsky | H01R 12/57 439/71 |
| 7,537,461 | B2 | * | 5/2009 | Rathburn | H01R 13/2414 439/66 |
| 8,441,275 | B1 | * | 5/2013 | Alladio | G01R 1/0466 324/756.01 |

* cited by examiner

*Primary Examiner* — Paresh Patel
(74) *Attorney, Agent, or Firm* — Maschoff Brennan

(57) ABSTRACT

An electrical contact that employs a common compressible layer for all contacts, wherein the compressible layer is fashioned with ducts that contain bridges within them. The bridges are formed of the compressible layer. This bridge serves as a compressible member for a first and second member in electrical contact with each other, and that interact with each other such that a compression force acted on the first and second members will cause them to maintain electrical contact while compressing the bridge. When the compressive force is released, the bridge, acting like a spring, expands thus pushing the first and second members apart, but still in electrical contact with each other.

1 Claim, 15 Drawing Sheets

COMPRESSIBLE LAYER WITH INTEGRATED BRIDGE IN IC TESTING APPARATUS

FIELD OF INVENTION

The present invention relates generally to electrical contacts, and more specifically to an electrical contact of an integrated circuit testing apparatus with a compressible layer.

BACKGROUND OF INVENTION

A huge number of solutions exist for effective electrical contact between the leads of an Integrated Circuit (IC) device and a test apparatus. Such an apparatus is used to evaluate performance of the IC device, and to remove from further production those devices that are faulty.

Many of these solutions focus on the configuration of the components used to effect the electrical contact. Because the testing is done at a very high speed, with very high stresses on the components, both electrical and mechanical factors must be considered. Typical considerations include the life span requirements, ease of repairing and replacing components, ease of customizing different configurations, quality of electrical contact, and maintenance.

Manufacturing of IC devices have inherent variations, resulting in variations in the performance of IC devices even within the same batch. It is important for the manufacturer to grade, and subsequently sort, each IC device according to its performance. This will allow the manufacturer to charge a premium for the IC devices that perform better. Hence, it is crucial for the testing apparatus to maintain a non-distorting electrical contact, so that results are as accurate as possible.

One solution for electrical contact between IC devices and testing apparatus is the so called pogo pin design (U.S. Pat. No. 6,506,082). This design has the disadvantage of having to replace the entire electrical contact when it fails. Furthermore, for high frequency testing, where shorter designs are desirable, spring loaded designs need to be wider to maintain a similar spring mass, so there is a compromise between height and finer pitching. Yet another disadvantage of this design is its unsustainable performance under high testing temperatures due to reduction of spring forces at high temperatures.

Another design is the pins within elastomer design (Vaynkof, et. al. U.S. Pat. No. 5,385,477), which is a series of gold particle strains embedded within a compressible layer such as an elastomer. This design has the disadvantage of not being able to make very good electrical contact due to disjoining gold particles. This design also requires the entire mat to be replaced for only a single malfunctioning contact, creating a lot of waste.

Several other designs suffer from downsides such as not being able to be customized by the user onsite, an insufficient current carrying capacity, a high number of components leading to insertion losses, and non-configurable contact forces.

What is needed in the art is an electrical contact that eliminates the afore-mentioned disadvantages.

SUMMARY OF INVENTION

The present invention seeks to overcome the aforementioned disadvantages by providing an electrical contact that employs a common compressible layer for all contacts, wherein the compressible layer is fashioned with ducts that contain bridges within them. The bridges are formed of the compressible layer. This bridge serves as a compressible member for a first and second member in electrical contact with each other, and that interact with each other such that a compression force acted on the first and second members will cause them to maintain electrical contact whilst compressing the bridge. When the compressive force is released, the bridge, acting like a spring, expands thus pushing the first and second members apart, but still in electrical contact with each other.

This invention thus relates to an electrical contact for use in an integrated circuit testing apparatus, comprising: a rigid first member having two planar surfaces sloping towards each other, such that said first member has a narrower end, and said first member formed of an electrically conductive material; a flexible second member having two arms extending over said first member, said two arms having an inwards bias such that an inner surface of each said arm is pressed in contact with each said planar surface, said second member formed of an electrically conductive material; and a compressible layer made of an elastic material and having at least one duct extending through said compressible layer, and a bridge within said duct formed of said compressible layer, said bridge located between a narrower upper end of said first member and a bifurcation inner surface of said second member. A pair of rigid layers that sandwich said compressible layer is also provided, said rigid layers adapted to provide support to said compressible layer.

A first embodiment of this invention relates to an electrical contact for use in an integrated circuit testing apparatus wherein the said bridge has a cylindrical shape, and the said upper end of said first member is adapted to match and receive the said bridge. In this first embodiment, the bridge is located at an intermediate point within said duct. That is to say, the top of each bridge is lower than the highest point of said compressible layer, and the bottom of each bridge is higher than a lowest point of said compressible layer.

In a second embodiment of this invention, the bridge is formed when a pair of through holes is machined through the compressible layer. As such, the bridge is as thick as the compressible layer, and is square in shape. A pretension rigid layer is necessary in this embodiment between the compressible layer and the first rigid layer, with openings that are aligned, but slightly larger to that of the first rigid layer. This is to prevent the arms of the second member from striking the first rigid layer.

Other embodiments of this invention are possible with variations to the shape of the bridge. The possible shapes of the bridge can be, but are not limited to, any of the following: square, oblong, triangle, hexagon, and octagonal. In each case, the bifurcation inner surface of said second member may be adapted to match and receive the said bridge. The upper end of said first member may also be adapted to match and receive the bridge.

The present invention comprises 3 main elements with a design that allows for quick assembly, and allows control of gram force by virtue of the placement of the compressible member in its design. The first and second members comprise the electrical contacting components, while the bridge formed of the compressible layer acts as the spring force when a compressive force acting on the first and second members is released.

In a further embodiment, there may be added a pair of lower bridges, each lower bridge located between a tip of each arm of the second member and the first member.

A method of manufacturing a compressible layer for use in an electrical contact in an integrated circuit testing apparatus whereby at least one pair of through-holes is machined through said compressible layer so that a bridge is formed between said pair of through-holes.

A method of manufacturing a compressible layer for use in an electrical contact in an integrated circuit testing apparatus whereby at least one duct is molded out of said compressible layer so that a bridge is formed within said duct.

The present invention further relates to a method of manufacturing a compressible layer for use in an electrical contact in an integrated circuit testing apparatus whereby at least one pair of through-holes is punched through said compressible layer so that a square-shaped bridge is formed between said pair of through-holes.

The present invention allows a user to customize the configuration of pins on-site, as required by the particular test. While prior art methods require the entire board to be delivered pre-configured by the manufacturer, the present invention allows easy removal of the first and second rigid layers by the user, on-site, so that the electrical contacts may be added or removed as needed to form any configuration that is required, of course limited to the number of openings on each compressible layer, first and second rigid layer assembly.

The present invention also allows quick and easy replacement of faulty electrical contacts by the user, on-site. This is facilitated by the removability of the first and second rigid layers. The first rigid layer can be removed to replace any one of the second members, and the second rigid layer can be removed to replace any one of the first members.

The present invention can operate under higher testing temperatures, by virtue of its design. Many prior art designs, such as the spring and pogo pin design, are susceptible to deformation at high temperatures. This does not happen with our design.

Other objects and advantages will be more fully apparent from the following disclosure and appended claims.

Figure 1:
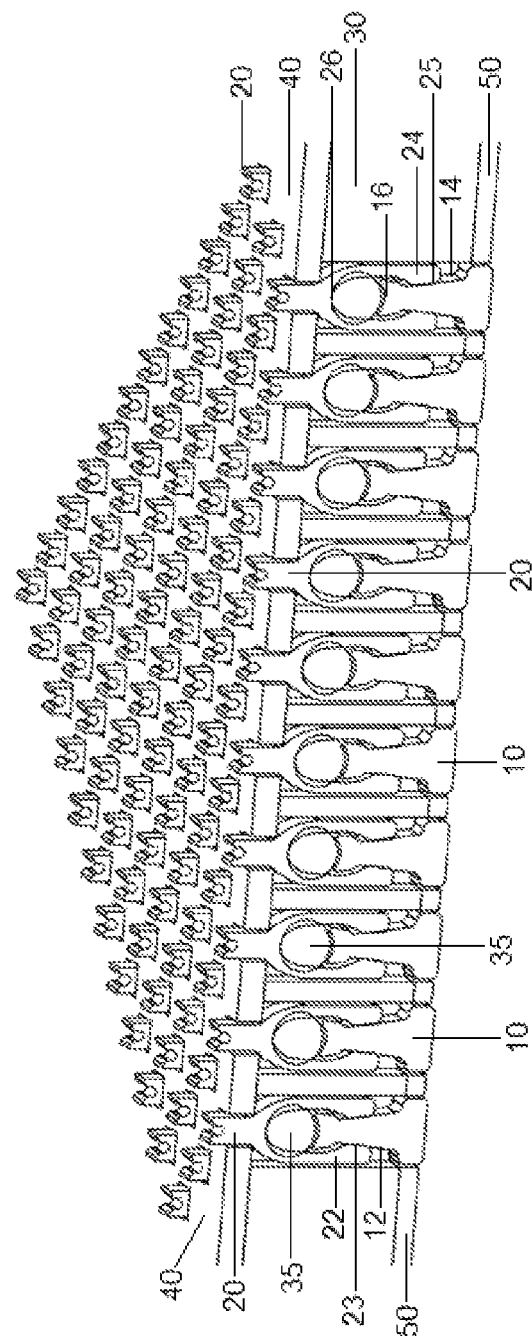
FIG. 1 shows a cross-sectional close up view of an electrical contact assembly in a first embodiment of the present invention.
Figure 2:
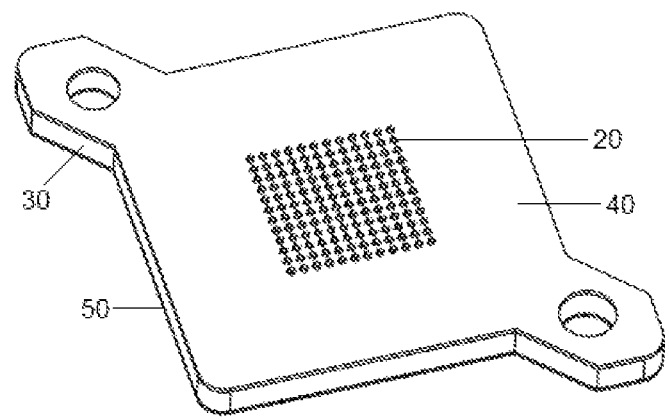
FIG. 2 shows a perspective view of an electrical contact assembly in a first embodiment of the present invention.

First member (10)
Left planar surface (12) of first member
Right planar surface (14) of first member
Upper end (16) of first member
Second member (20)
Left arm (22) of second member
Left arm inner surface (23) of second member
Right arm (24) of second member
Right arm inner surface (25) of second member
Bifurcation inner surface (26) of second member
Compressible layer (30)
Duct (33)
Bridge (35)
Left lower bridge (36)
Right lower bridge (37)
First rigid layer (40)
Second rigid layer (50)
Pretension rigid layer (60)

DETAILED DESCRIPTION OF INVENTION

It should be noted that the following detailed description is directed to an electrical contact of an integrated circuit testing apparatus, and is not limited to any particular size or configuration but in fact a multitude of sizes and configurations within the general scope of the following description.

FIGS. 1 to 9 show an electrical contact of an integrated circuit (IC) testing apparatus in a first embodiment of this invention. Referring to FIGS. 1 to 9, there is shown a plurality of rigid first members (10), each said first member having a left planar surface (12) and a right planar surface (14) that slope towards each other, so that said first member forms a partial wedge shape, with a narrower upper end (16) of the wedge facing upwards, is shown. Each said first member (10) is connected to a corresponding second member (20), said second member having two arms, a left arm (22) and a right arm (24), extending over said first member (10), such that the second member forms an inverted U-shape. The second member (20) is designed to allow flexing of the two arms (22, 24). The said arms (22, 24) are designed to have an inwards bias such that an inner surface (23) of said left arm (22) is pressed in contact with said left planar surface (12), and an inner surface (25) of said right arm (24) is pressed in contact with said right planar surface (14). In this way, during use, the first (10) and second (20) members form an electrical connection between each other. Also shown is a compressible layer (30) that is located between a first rigid layer (40) and a second rigid layer (50). The compressible layer (30) is provided with a plurality of through ducts (33). The ducts (33) are such that they form bridges (35) out of the said compressible layer (30). Each bridge (35) and duct (33) are designed to accept the said first (10) and second (20) members. Each bridge (35) is designed to act as a compressible member, such that a compression force acting on the first (10) and second (20) members will cause them to maintain electrical contact with each other whilst compressing the bridge (35). When the compressive force is released, the bridge (35), acting like a spring, expands thus pushing the first (10) and second (20) members apart, but still in electrical contact with each other. The first rigid layer (40) can be easily removed to facilitate repairs or replacement of the second member (20). The said bridge (35) is located between the said upper end (16) of the said first member (10) and a bifurcation inner surface (26) of the second member (20), which is an inner surface where the said two arms (22, 24) bifurcate. The first member (10) and second member (20) are made of any electrically conductive material.

Still referring to FIGS. 1 to 9, during testing of the IC device, the second member (20) is first subjected to a downwards force from an IC device above. When this happens, the bridge (35) compresses and allows the said second member to move closer towards the first member (10). As this happens, the inner surfaces (23, 25) of the said arms (22, 24) slide downwards along the sloping planar surfaces (12, 14) of the first member (10), and the two arms (22, 24) of the second member flex outwards, and maintain inward pressure on the said planar surfaces (12, 14) of said first member (10). When the IC device is lifted away from the testing apparatus, the bridge (35) decompresses and forces the second member (20) away from the said first member (10). As this happens, the inwards pressure of the two arms (22, 24) acting on the said planar surfaces (12, 14) of first member (10) keeps the inner surfaces (23, 25) of each arm in contact with the said planar surfaces (12, 14) of the said first member (10). In this way, electrical contact is maintained throughout the testing period.

In the first embodiment shown in FIGS. 1 to 9, the said bridge (35) is cylindrical in shape. The axis of this cylinder is in a horizontal plane, that is, perpendicular to the direction of a force applied to it during testing of the IC device. The upper end (16) of the first member (10) is adapted to match and receive the cylindrical shape of the bridge (35). In other words, the upper end (16) of the first member (10) has an upper side that is curved to receive the cylindrical shape of the bridge (35). A bifurcation inner surface (26) of the second member, that is where the two arms (22, 24) bifurcate, is likewise adapted, or curved, to match and receive the cylindrical shape of the bridge (35). An upper portion of the second member (20) absorbs the force stresses as the IC device contacts the second member (20), and this force is dissipated into the bridge (35).

Figure 3:
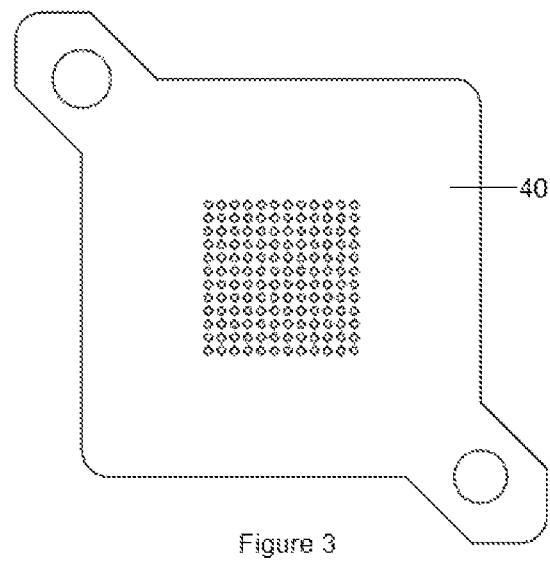
FIG. 3 shows a top view of a first rigid layer in a first embodiment of the present invention.
Figure 4:
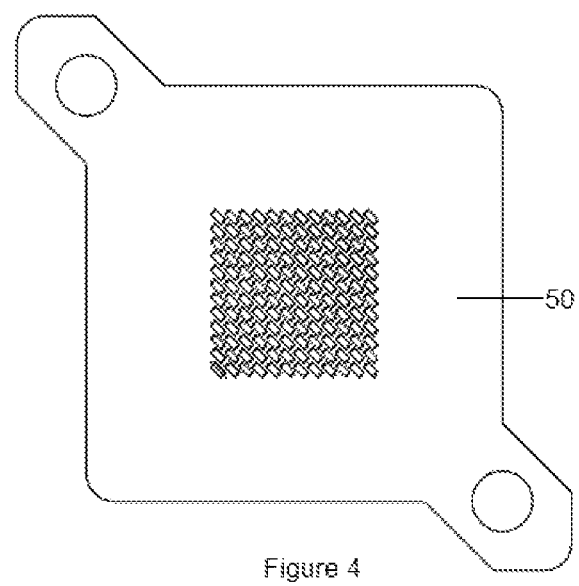
FIG. 4 shows a top view of a second rigid layer in a first embodiment of the present invention.
Figure 5:
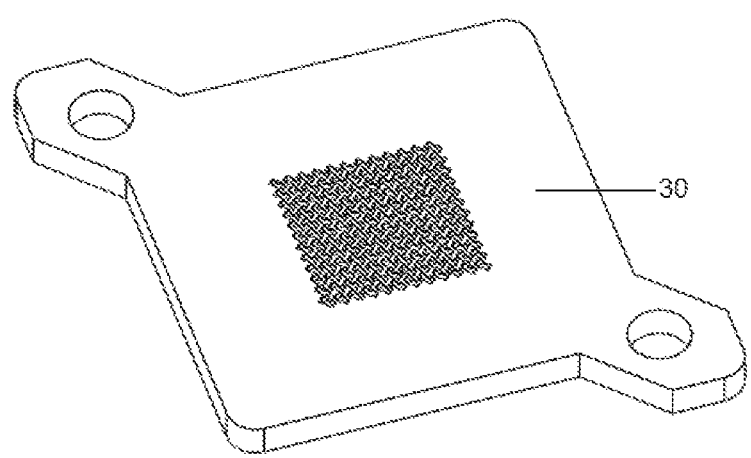
FIG. 5 shows a perspective view of a compressible layer in a first embodiment of the present invention.

FIGS. 3 and 4 show, respectively, a first rigid layer (40) and a second rigid layer (50) of this invention. These rigid layers are made of high performance engineering plastic such as Torlon, Ultem, Kapton, Cirlex, Peek, Semitron, Teflon, etc. The first rigid layer (40) can be removed by the operator, which allows for easy repairing and replacements of the second member (20) when necessary. The second rigid layer (50) can also be removed by the operator, which allows for easy repairing and replacements of the first member (20) when necessary.

Figure 6:
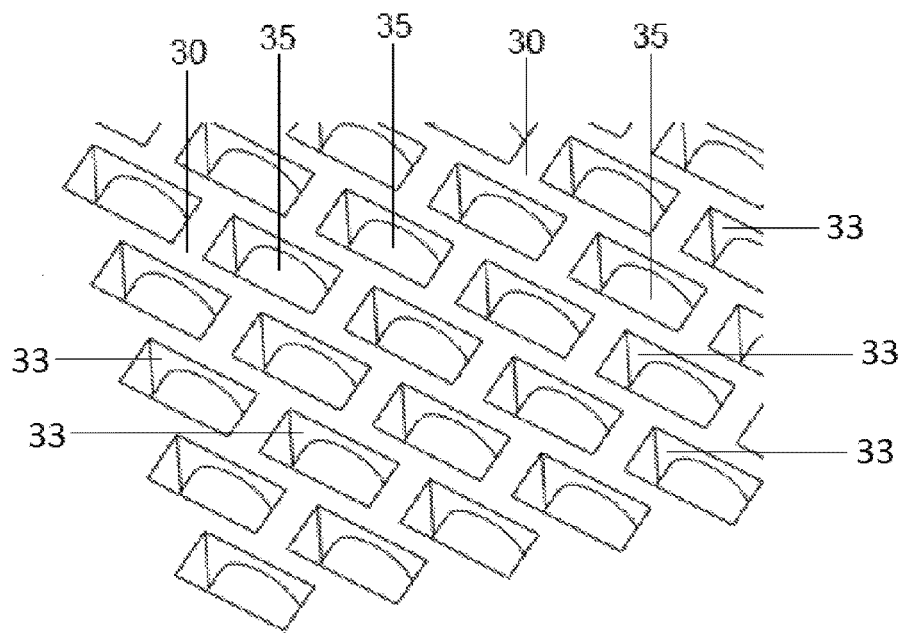
FIG. 6 shows a close up view of ducts in a compressible layer in a first embodiment of the present invention.
Figure 7:
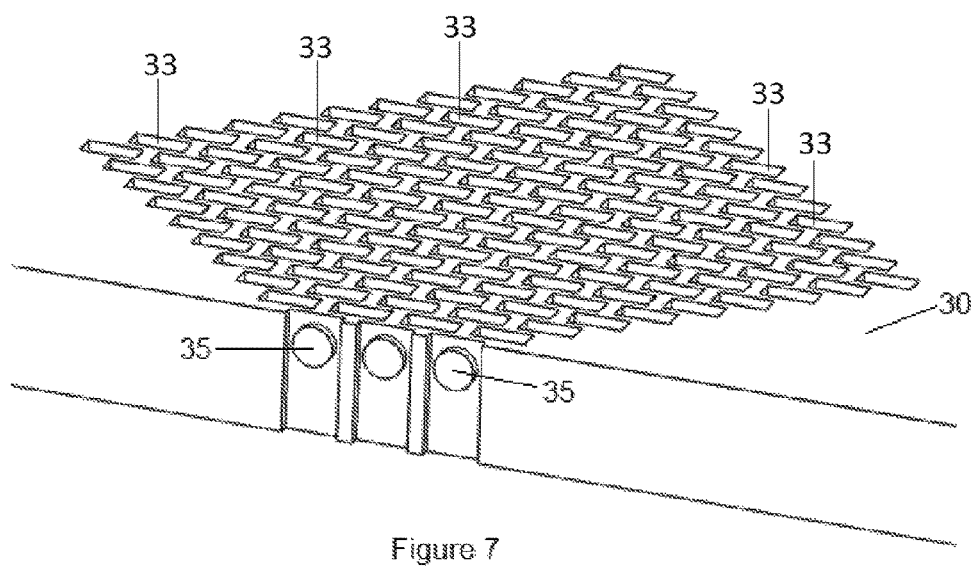
FIG. 7 shows a cross sectional view of a compressible layer in a first embodiment of the present invention.
Figure 8:
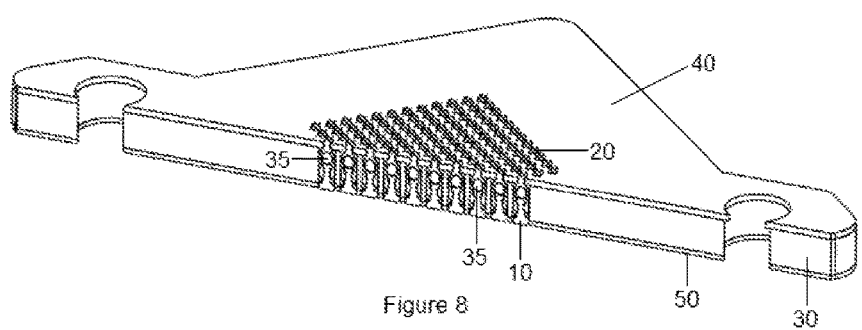
FIG. 8 shows a cross-sectional view of an electrical contact assembly in a first embodiment of the present invention.
Figure 9:
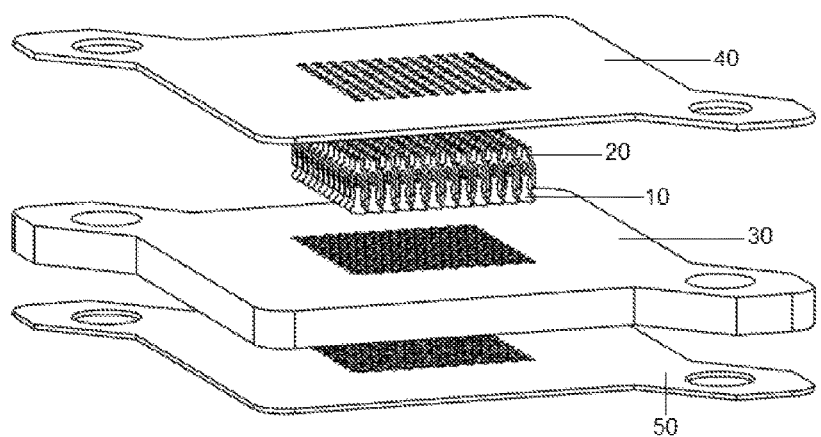
FIG. 9 shows an exploded view of an electrical contact assembly in a first embodiment of the present invention.

Referring to FIGS. 6 and 7, there is shown views of the compressible layer (30) with a plurality of ducts (33) molded out of said compressible layer (30) to form a bridge (35) within each said duct (33). In this first embodiment, the bridge is located at an intermediate point within said duct (33). That is to say, the top of each bridge (35) is lower than the highest point of said compressible layer (30), and the bottom of each bridge (35) is higher than a lowest point of said compressible layer (30).

Figure 10:
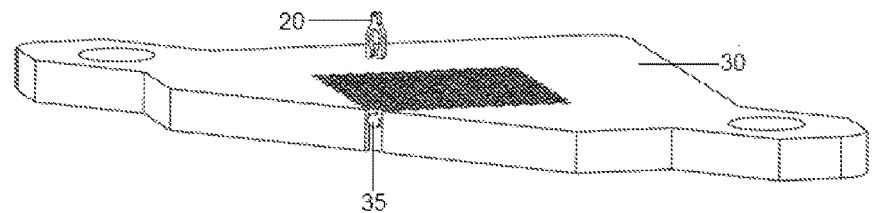
FIG. 10 shows a cross-sectional view of a second member being installed in a first embodiment of the present invention.
Figure 11:
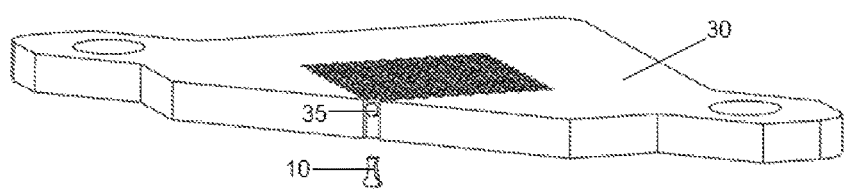
FIG. 11 shows a cross-sectional view of a first member being installed in a first embodiment of the present invention.
Figure 12:
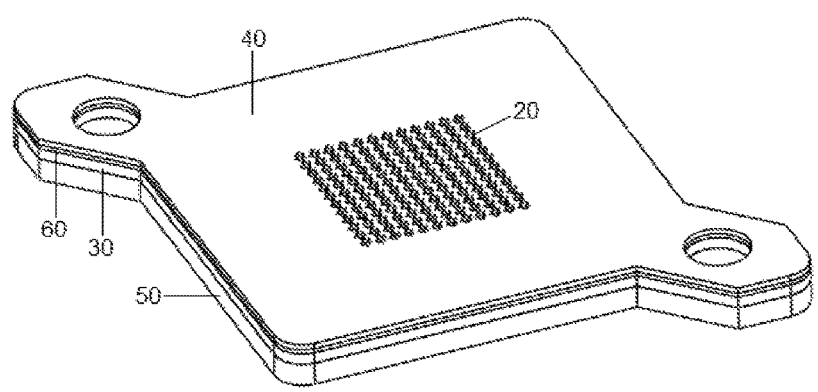
FIG. 12 shows a perspective view of an electrical contact assembly in a second embodiment of the present invention.

FIGS. 10 and 11 show a method of assembling the electrical contact in a first embodiment of the present invention onto a compressible layer (30). A first member (10) is placed at one side of said compressible layer (30), in alignment with a bridge (35) formed of said compressible layer (30). A second member (20) is placed at an opposing end of said compressible layer (30). This second member has two arms, a left arm (22) and a right arm (24), and is designed to allow flexing of the two arms (22, 24). As the second member (20) reaches the bridge (35), these two arms (22, 24) flex outwards and around said bridge (35). The said arms (22, 24) are designed to have an inwards bias so that, once the tips of said arms (22, 24) pass the bridge (35), they move inwards toward each other and an inner surface (23) of said left arm (22) is pressed in contact with a left planar surface (12) of the first member (10). Likewise, an inner surface (25) of said right arm (24) is pressed in contact with a right planar surface (14) of first member (10). In this way, during use, the first (10) and second (20) members form a tight mechanical, and thus good electrical connection, between each other. During testing, if said first member (10) should become faulty, the operator may easily remove the said second rigid layer (50) and then proceed to replace the faulty first member (10). Similarly, if said second member (20) should become faulty, the operator may easily remove the said first rigid layer (40) and then proceed to replace the faulty second member (20).

FIGS. 12 to 19 show an electrical contact of an integrated circuit (IC) testing apparatus in a second embodiment of this invention. Referring to FIGS. 12 to 19, there is shown a plurality of rigid first members (10), each said first member having a left planar surface (12) and a right planar surface (14) that slope towards each other, so that said first member forms a partial wedge shape, with a narrower upper end (16) of the wedge facing upwards, is shown. Each said first member (10) is connected to a corresponding second member (20), said second member having two arms, a left arm (22) and a right arm (24), extending over said first member (10), such that the second member forms an inverted U-shape. The second member (20) is designed to allow flexing of the two arms (22, 24). The said arms (22, 24) are designed to have an inwards bias such that an inner surface (23) of said left arm (22) is pressed in contact with said left planar surface (12), and an inner surface (25) of said right arm (24) is pressed in contact with said right planar surface (14). In this way, during use, the first (10) and second (20) members form an electrical connection between each other. Also shown is a compressible layer (30) that is located between a first rigid layer (40) and a second rigid layer (50). The compressible layer (30) is provided with a plurality of pairs through ducts, such as the ducts 33 of FIGS. 6 and 7. The ducts (33) are such that they form bridges (35) out of the said compressible layer (30). Each bridge (35) and duct (33) are designed to accept the said first (10) and second (20) members. Each bridge (35) is designed to act as a compressible member, such that a compression force acting on the first (10) and second (20) members will cause them to maintain electrical contact with each other whilst compressing the bridge (35). When the compressive force is released, the bridge (35), acting like a spring, expands thus pushing the first (10) and second (20) members apart, but still in electrical contact with each other. The first rigid layer (40) can be easily removed to facilitate repairs or replacement of the second member (20). The said bridge (35) is located between the said upper end (16) of the said first member (10) and a bifurcation inner surface (26) of the second member (20), which is an inner surface where the said two arms (22, 24) bifurcate. The first member (10) and second member (20) are made of any electrically conductive material.

Still referring to FIGS. 12 to 19, during testing of the IC device, the second member (20) is first subjected to a downwards force from an IC device above. When this happens, the bridge (35) compresses and allows the said second member to move closer towards the first member (10). As this happens, the inner surfaces (23, 25) of the said arms (22, 24) slide downwards along the sloping planar surfaces (12, 14) of the first member (10), and the two arms (22, 24) of the second member flex outwards, and maintain inward pressure on the said planar surfaces (12, 14) of said first member (10). When the IC device is lifted away from the testing apparatus, the bridge (35) decompresses and forces the second member (20) away from the said first member (10). As this happens, the inwards pressure of the two arms (22, 24) acting on the said planar surfaces (12, 14) of first member (10) keeps the inner surfaces (23, 25) of each arm in contact with the said planar surfaces (12, 14) of the said first member (10). In this way, electrical contact is maintained throughout the testing period.

Figure 19:
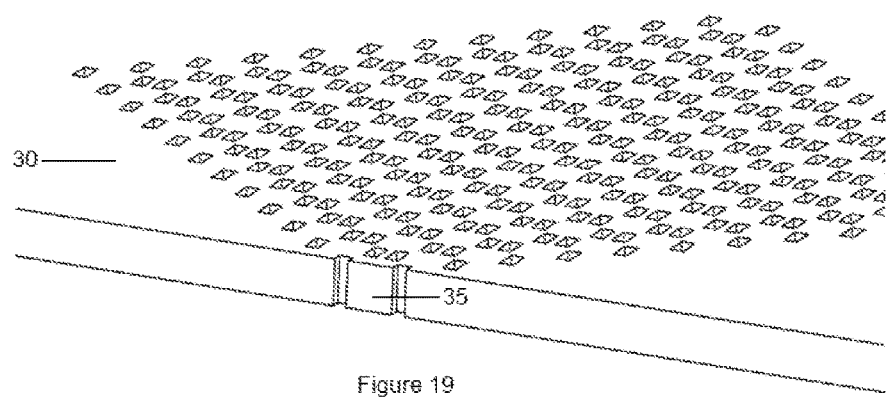
FIG. 19 shows a cross sectional view of a compressible layer in a second embodiment of the present invention.

In this second embodiment, as can be seen in FIG. 19, the bridge (35) is formed when a pair of through holes is machined by laser cutting through the compressible layer (30). As such, the bridge (35) is as thick as the compressible layer, and is square in shape. A pretension rigid layer (60) is necessary in this embodiment, and it is placed between the compressible layer (30) and the first rigid layer (40), with openings that are aligned, but slightly larger to that of the first rigid layer (40). This is to prevent the arms (22, 24) of the second member (20) from striking the first rigid layer (40) during testing.

Figure 13:
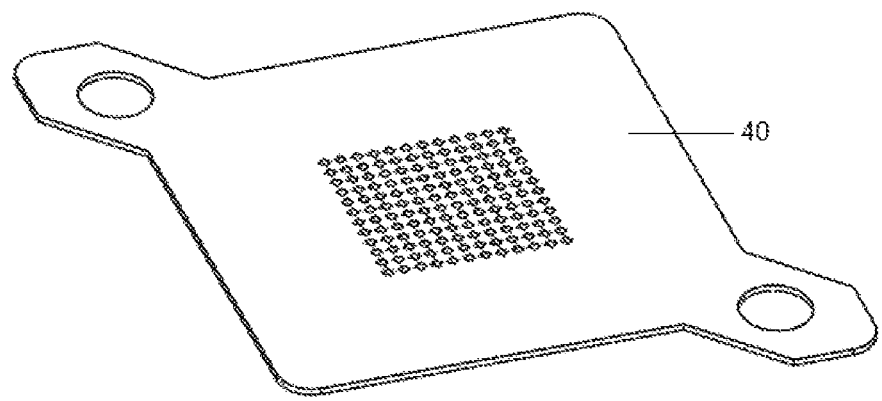
FIG. 13 shows a perspective view of a first rigid layer in a second embodiment of the present invention.
Figure 14:
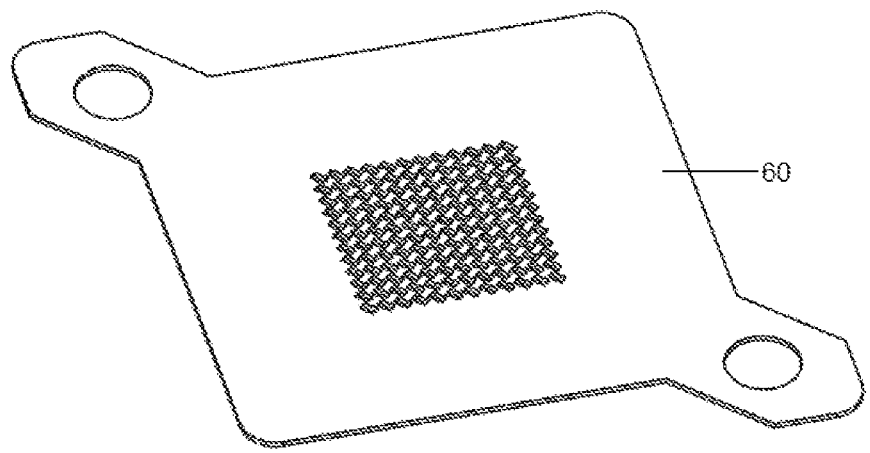
FIG. 14 shows a perspective view of a pretension rigid layer in a second embodiment of the present invention.
Figure 15:
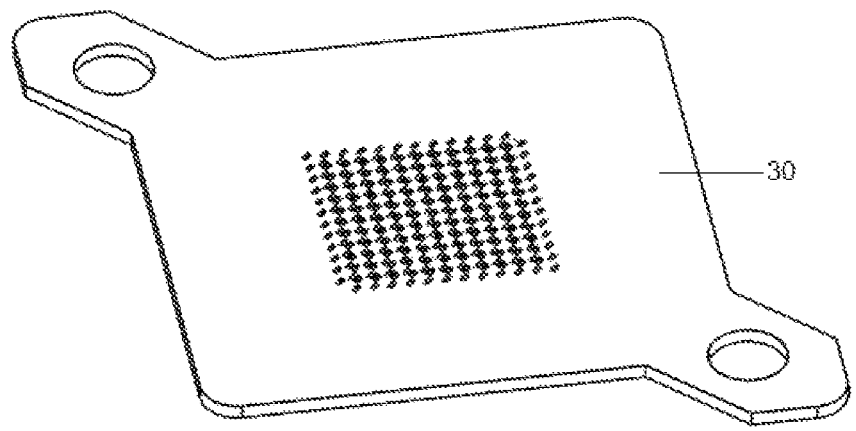
FIG. 15 shows a perspective view of a compressible layer in a second embodiment of the present invention.
Figure 16:
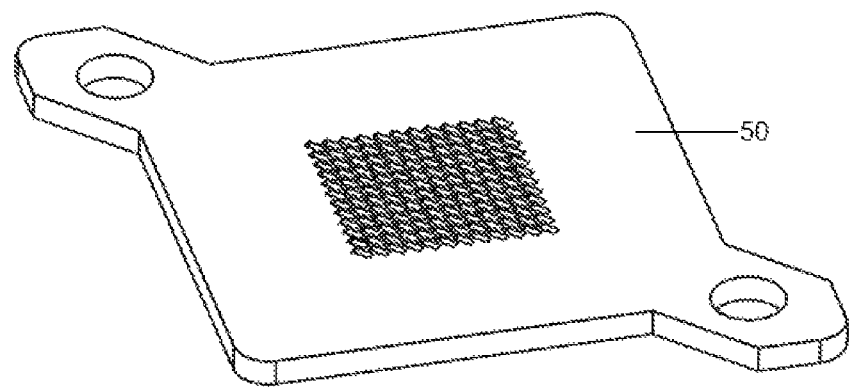
FIG. 16 shows a perspective view of a second rigid layer in a second embodiment of the present invention.
Figure 17:
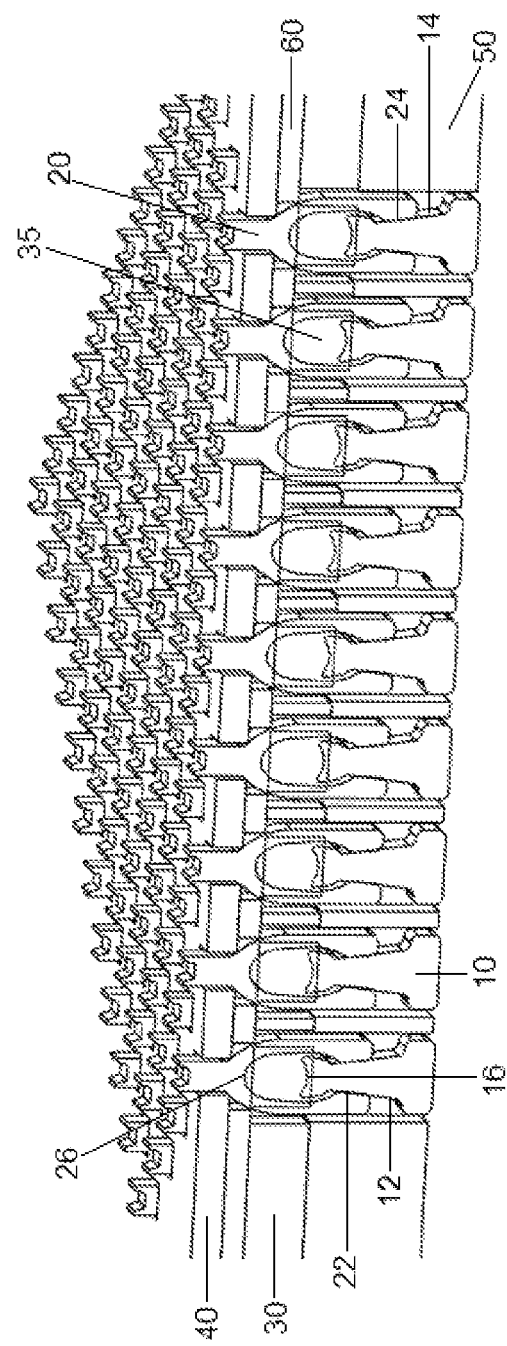
FIG. 17 shows a cross-sectional close up view of an electrical contact assembly in a second embodiment of the present invention.
Figure 18:
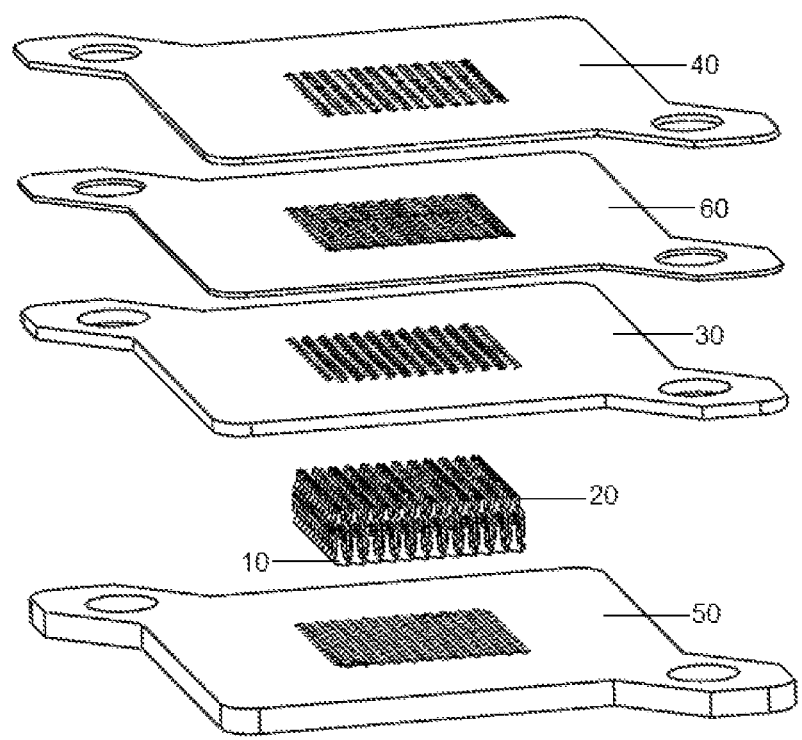
FIG. 18 shows an exploded view of an electrical contact assembly in a second embodiment of the present invention.

FIGS. 13, 14 and 16 show, respectively, a first rigid layer (40), a pretention layer (60), and a second rigid layer (50) of this invention. These rigid layers are made of high performance engineering plastic such as Torlon, Ultem, Kapton, Cirlex, Peek, Semitron, Teflon, etc. The first (40) and pretension (60) rigid layers can be removed by the operator, which allows for easy repairing and replacements of the second member (20) when necessary. The second rigid layer (50) can also be removed by the operator, which allows for easy repairing and replacements of the first member (20) when necessary.

Figure 20:
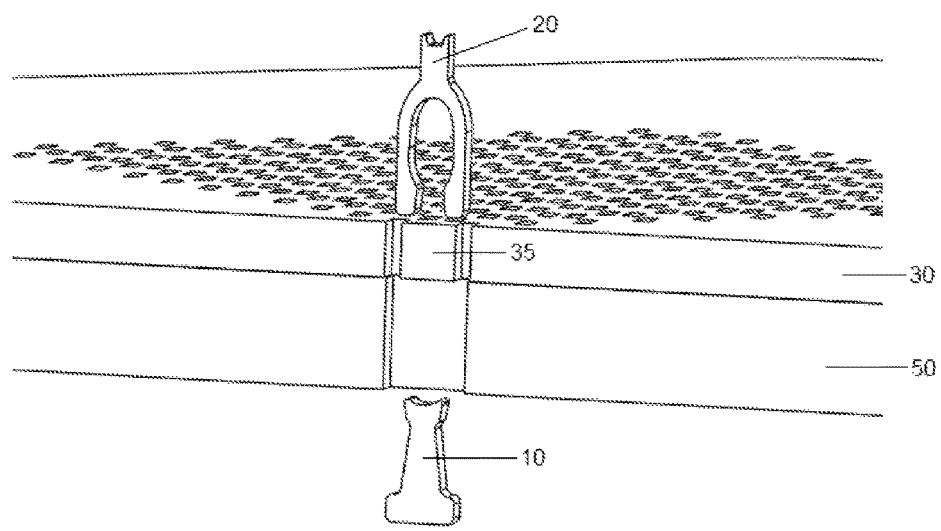
FIGS. 20 and 21 show cross sectional views of a first and second member being installed in a second embodiment of the present invention.
Figure 21:
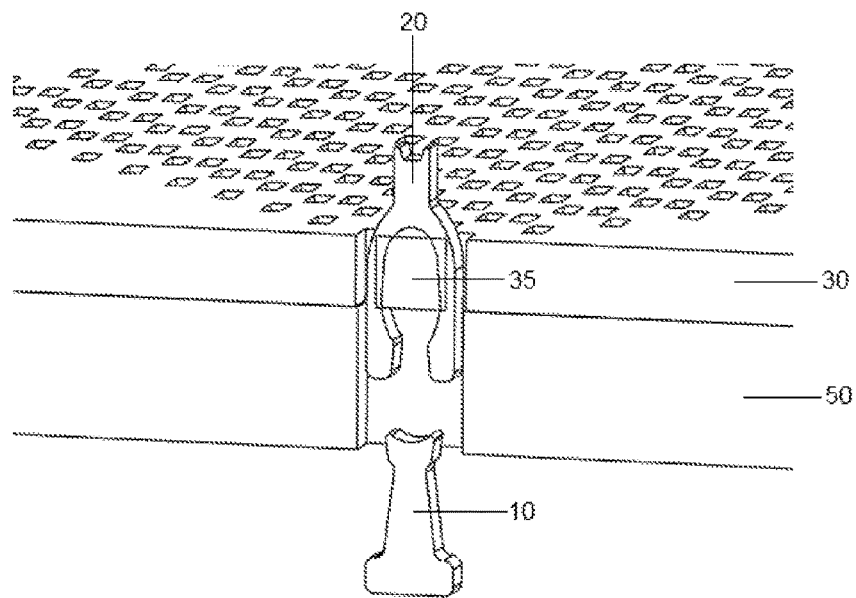
Figure 22:
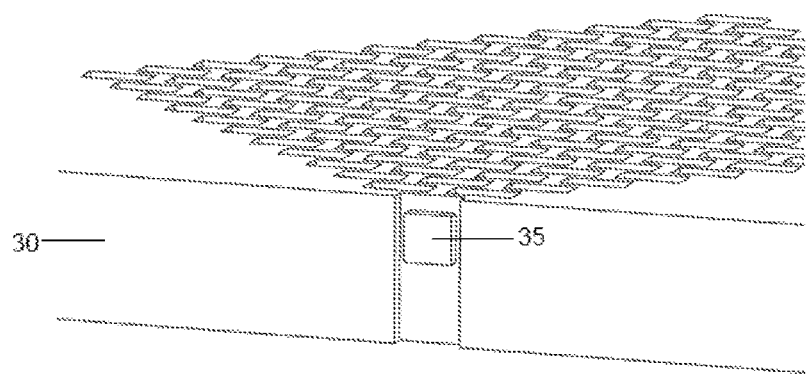
FIG. 22 shows a square bridge in a third embodiment of the present invention.

FIGS. 20 and 21 show a method of assembling the electrical contact in a first embodiment of the present invention onto a compressible layer (30). A first member (10) is placed at one side of said compressible layer (30), in alignment with a bridge (35) formed of said compressible layer (30). A second member (20) is placed at an opposing end of said compressible layer (30). This second member has two arms, a left arm (22) and a right arm (24), and is designed to allow flexing of the two arms (22, 24). As the second member (20) reaches the bridge (35), these two arms (22, 24) flex outwards and around said bridge (35). The said arms (22, 24) are designed to have an inwards bias so that, once the tips of said arms (22, 24) pass the bridge (35), they move inwards toward each other and an inner surface (23) of said left arm (22) is pressed in contact with a left planar surface (12) of the first member (10). Likewise, an inner surface (25) of said right arm (24) is pressed in contact with a right planar surface (14) of first member (10). In this way, during use, the first (10) and second (20) members form a tight mechanical, and thus good electrical connection, between each other. During testing, if said first member (10) should become faulty, the operator may easily remove the said second rigid layer (50) and then proceed to replace the faulty first member (10). Similarly, if said second member (20) should become faulty, the operator may easily remove the said first rigid layer (40) and then proceed to replace the faulty second member (20).

FIGS. 22 through 25 show more embodiments of the present invention, with each embodiment being a variation of the shape of said bridge (35) in the compressible layer (30), all of which are compatible with this invention.

Figure 23:
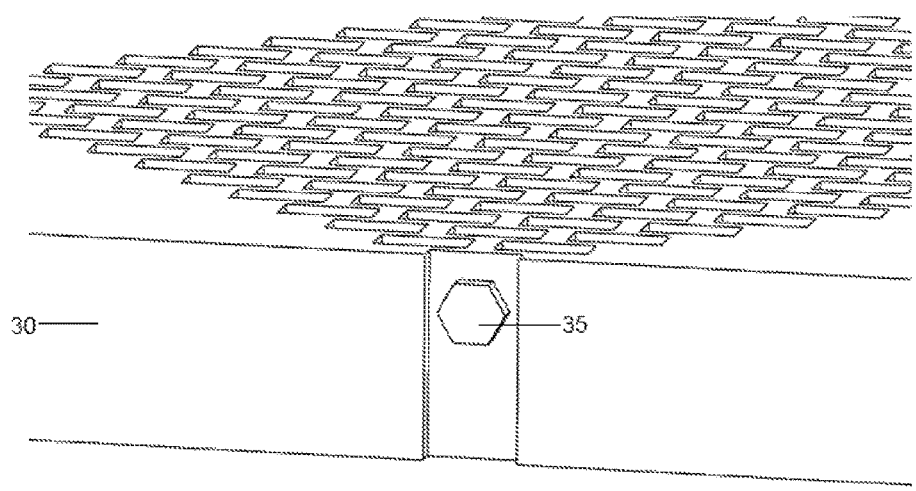
FIG. 23 shows a hexagonal bridge in a fourth embodiment of the present invention.

FIG. 23 shows an embodiment where the bridge (35) has a hexagonal shape.

Figure 24:
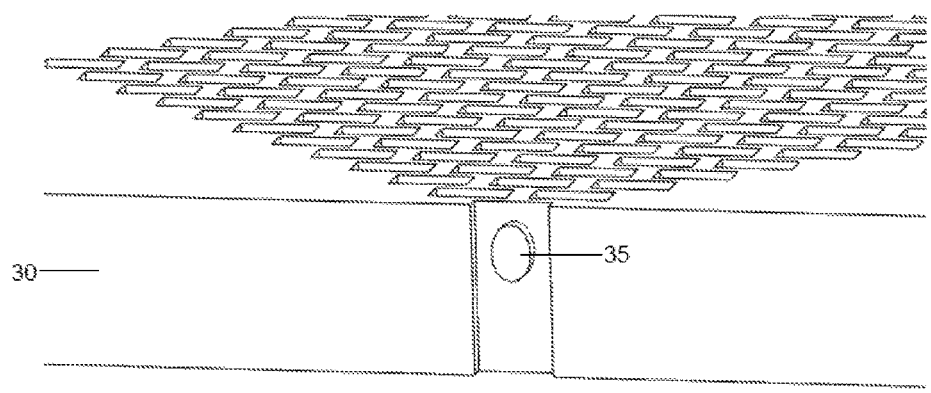
FIG. 24 shows an oblong bridge in a fifth embodiment of the present invention.

FIG. 24 shows an embodiment where the bridge (35) has an oblong shape.

Figure 25:
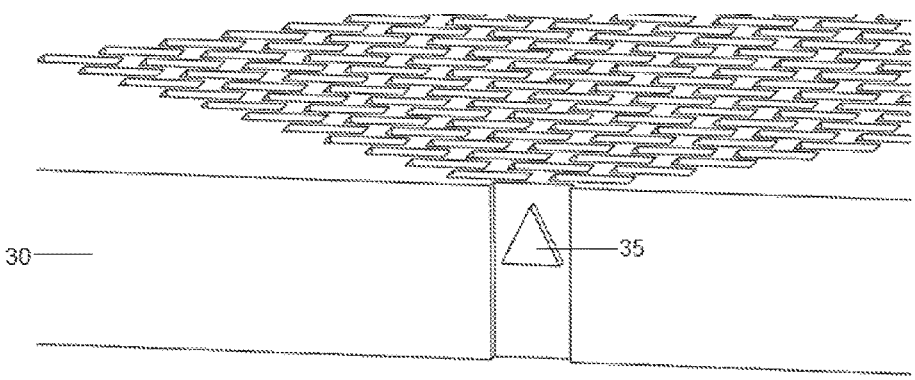
FIG. 25 shows a triangle bridge in a sixth embodiment of the present invention.

FIG. 25 shows an embodiment where the bridge (35) has a triangle shape.

Figure 26:
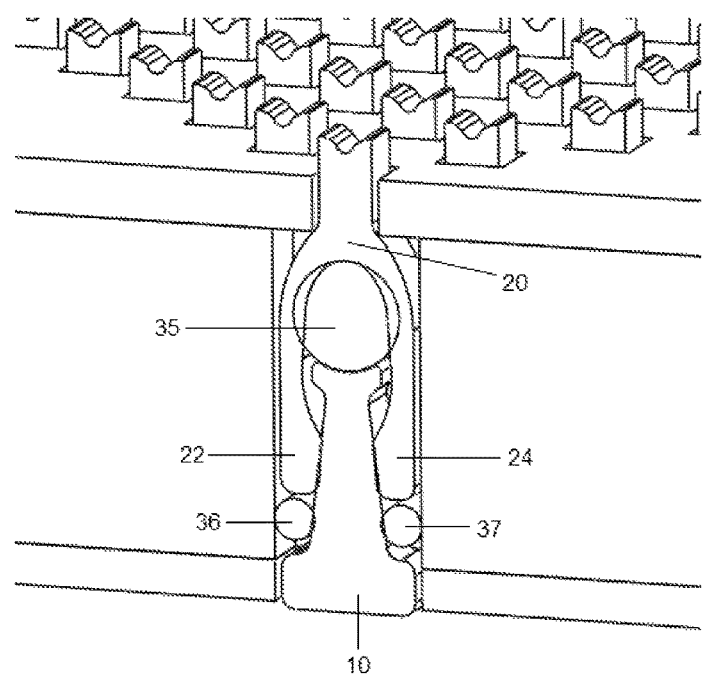
FIG. 26 shows a cross sectional view of an assembly in a seventh embodiment of the present invention.
Figure 27:
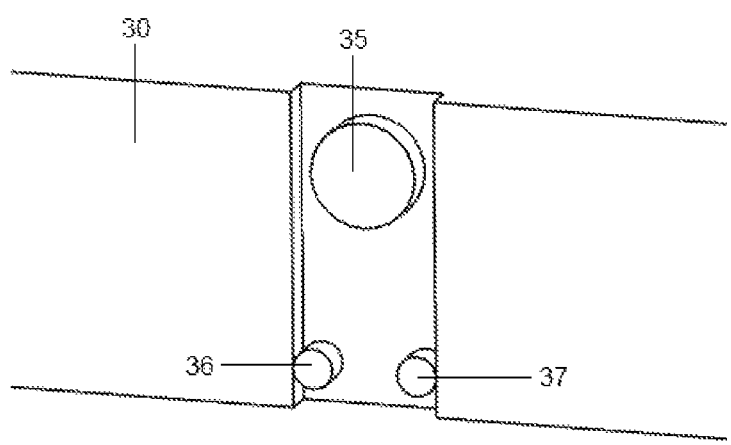
FIG. 27 shows a cross sectional view of a compressible layer in a seventh embodiment of the present invention.

FIGS. 26 and 27 show a seventh embodiment of the present invention which is the first embodiment above with the addition of a pair of lower bridges (36, 37), also formed of the compressible layer (30). A left lower bridge (36) is located between a tip of a left arm (22) of a second member (20) and a first member (10). A right lower bridge (37) is located between a tip of a right arm (24) of a second member (20) and a first member (10). These lower bridges (36, 37) assist a bridge (35) in absorbing compressive forces between a first (10) and second (20) member, and also in providing a spring force to push said first (10) and second (20) members away from each other once the said compressive force is removed.

While several particularly preferred embodiments of the present invention have been described and illustrated, it should now be apparent to those skilled in the art that various changes and modifications can be made without departing from the spirit and scope of the invention. Accordingly, the following claims are intended to embrace such changes, modifications, and areas of application that are within the scope of this invention.

The invention claimed is:
1. An electrical contact for use in an integrated circuit testing apparatus comprising:
   a rigid first member having two planar surfaces sloping towards each other, such that said first member has a upper end, and said first member formed of an electrically conductive material;
   a flexible second member having a first and a second arm extending over said first member, said arms having an inwards bias such that an inner surface of each said arm is pressed in contact with each said planar surface, said second member formed of an electrically conductive material;

a compressible layer made of an elastic material and having at least one duct extending through said compressible layer, and at least one bridge within each said duct formed in said compressible layer, said bridge located between an upper end of said first member and a bifurcation inner surface of said second member; and a pair of lower bridges, each said lower bridge located between a tip of each said arm and said first member.

* * * * *